(12) United States Patent
Hartley

(10) Patent No.: US 6,190,020 B1
(45) Date of Patent: Feb. 20, 2001

(54) LIGHT PRODUCING ASSEMBLY FOR A FLASHLIGHT

(76) Inventor: Fred Jack Hartley, 14641 Fair Havens Rd., Fort Myers, FL (US) 33908

( * ) Notice: Under 35 U.S.C. 154(b), the term of this patent shall be extended for 0 days.

(21) Appl. No.: 09/338,625

(22) Filed: Jun. 23, 1999

(51) Int. Cl.[7] .................................................. F21L 4/02
(52) U.S. Cl. .......................... 362/184; 362/205; 362/800
(58) Field of Search .................................. 362/184, 200, 362/205, 206, 208, 800

(56) References Cited

U.S. PATENT DOCUMENTS

| | | | |
|---|---|---|---|
| 4,152,755 | * 5/1979 | Trosper et al. | 362/205 |
| 4,760,504 | * 7/1988 | Schaller et al. | 362/205 |
| 5,124,898 | * 6/1992 | Chabria | 362/205 |
| 5,367,446 | * 11/1994 | Ellion | 362/184 |
| 5,655,830 | * 8/1997 | Ruskouski | 362/240 |
| 5,924,784 | * 7/1999 | Chliwnyj | 362/234 |
| 6,019,482 | * 2/2000 | Everett | 362/184 |
| 6,086,218 | * 7/2000 | Robertson | 362/184 |
| 6,095,661 | * 8/2000 | Lebens et al. | 362/184 |

* cited by examiner

Primary Examiner—Thomas M. Sember

(57) ABSTRACT

A light producing source for a collimating reflector type flashlight is explained. At least one light emitting diode acts as the light producing source wherein produced light is dispersed away from a central axis. This provides for utilization of the collimating reflector for collimation of the produced light into a beam of light for projection from the flashlight. Various diffusion methods are explained. A bulb assembly is capable of housing the required light production and dispersion components while retaining a sizing and outer shape which permits eventual usage in existing flashlights having incandescent lamps (bulbs) without requiring modification to the flashlight. Means are also explained to utilize a collimating reflector attachable to, or incorporated into, the bulb assembly wherein the produced light does not interact with an existing collimating reflector on the flashlight.

20 Claims, 6 Drawing Sheets

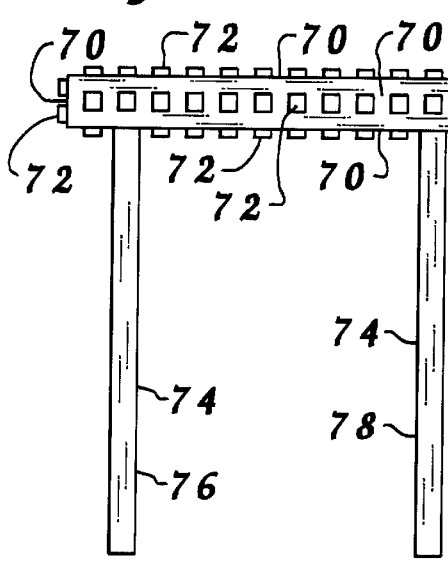
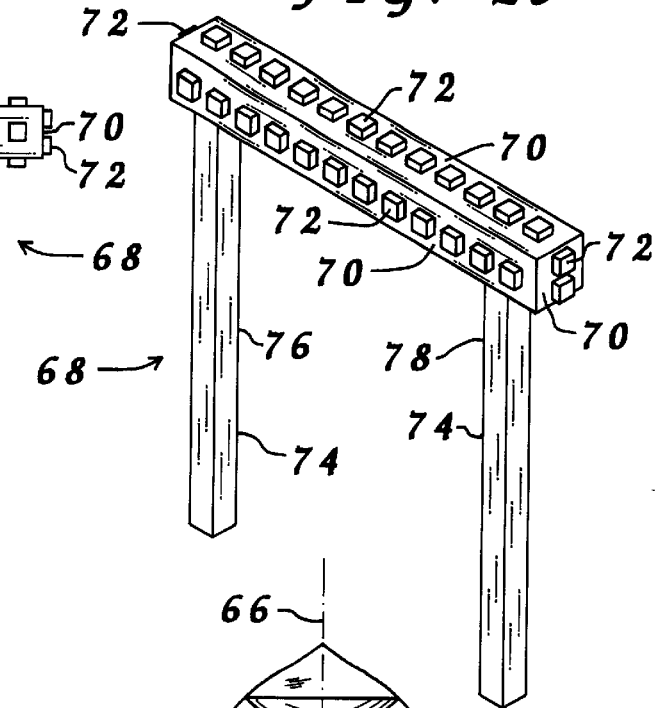
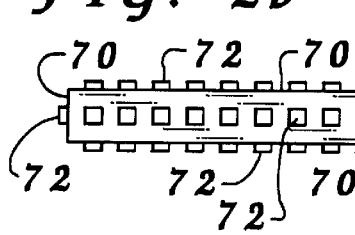
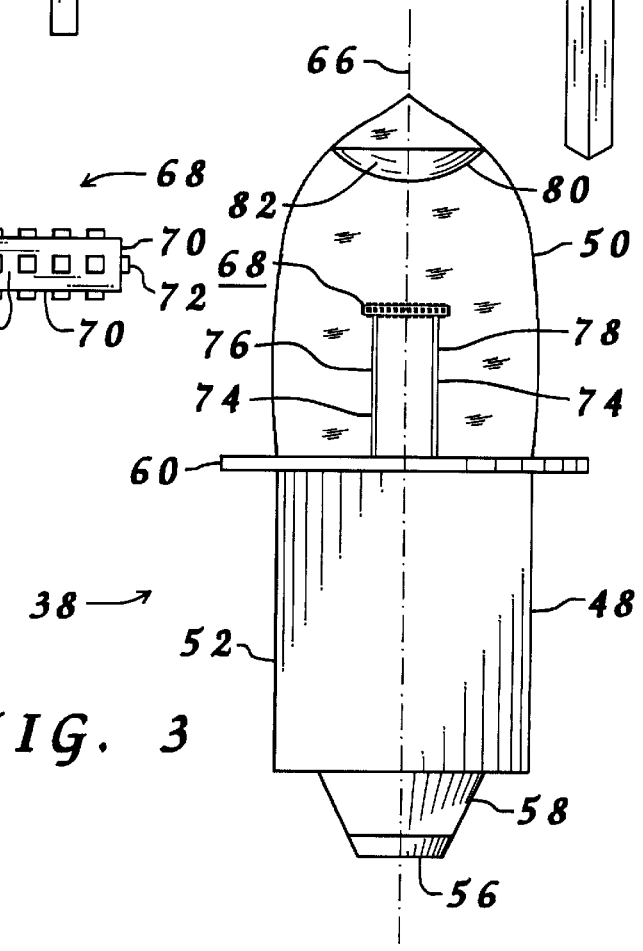

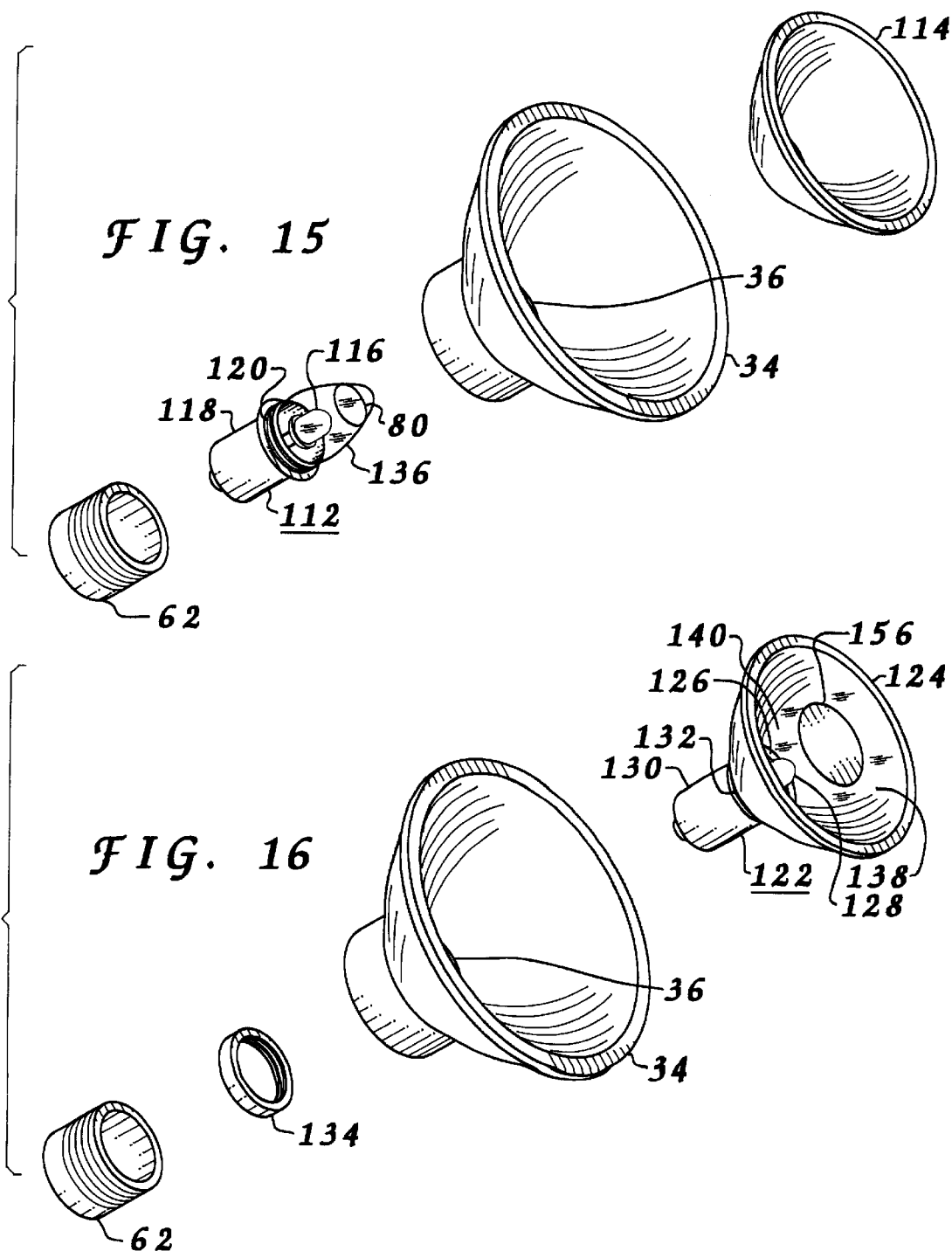

LIGHT PRODUCING ASSEMBLY FOR A FLASHLIGHT

BACKGROUND

1. Field of the Invention

Generally, the invention relates to light sources for collimating reflector type flashlights. More specifically, the invention relates to such light sources wherein at least one light emitting diode produces the light and means are provided for diffusion of the produced light to a collimating reflector for collimation of the produced light into a beam of light.

2. Description of the Prior Art

It is estimated that in 1998 over two hundred (200) million collimating reflector type flashlights were produced. Conventionally known flashlights which utilize a collimating reflector operate with incandescent lamps, (bulbs), which have a coiled filament placed in a geometric position compatible with the focal point of the collimating reflector.

Incandescent lamps, (bulbs), are constructed with a 'light center length' or LCL which is defined as the best strait line that can be passed through the majority of the lighted coil. A collimated beam of light, defined by 'beam candle power', is created when the coil is properly positioned to a focal point of the collimating reflector.

Collimating reflector flashlights utilizing light emitting diodes and the principles of the present invention will create a vast new market for light emitting diodes.

Conventional light emitting diodes generally are currently limited to small flashlights such as key chain type lights, small pen lights and small flashlights which do not utilized collimating reflectors to enhance the collimazation of the produced light. This is due primarily to the narrow view angle of the produced light and the lack of utilization of light bending surfaces or other diffusion methods. Attempts have been made to use light emitting diodes in incandescent lamp (bulb) bases. These attempts have been limited to providing a convenient light source for use in existing flashlights where the produced light does not interact with the collimating reflector of those flashlights. It is important to note that these replacement incandescent lamps using light emitting diodes heretobefore have not been designed to operate with the collimating reflector to produce a beam of light.

Conventional light emitting diode light sources lack light bending surfaces to broaden the narrow view angle of the produced light. The light emitting diode, in conventional form, does not make a satisfactory source of light for conventional flashlights because the point source of light is on a plane. The conventional light emitting diode is formed by the deposition of semiconductor materials and phosphors to a substrate in a planar configuration which inhibits use as a broad spectrum light source. Conventional collimating reflector flashlight require the broad spectrum light source.

The Polar light distribution of light emitting diodes is at best one hundred and twenty-five (125) degrees and most commonly fifteen (15) degrees. Convention collimating reflector flashlight require a polar distribution of three hundred and sixty (360) degrees, (radially), for maximum efficiency.

Conventional light emitting diodes use an acrylic or plastic molded lens package without an indices of refraction to broaden the angle of light transmission. Diffusion utilizing translucent coatings or finishes have been used to a minor degree with limited success.

Various methods exist in the art to alter the angle of projection of light. Such conventional methods to alter the angle of projection of light include lighted panels and annunciators, amongst others. Your applicant is unaware of utilization of such methods with light emitting diode light sources wherein the produced light may be efficiently used with flashlights having a conventional collimating reflector.

Light emitting diodes which produce white light, offer a new and superior light source in that they provide superior lamp life and battery run time. Conventional light emitting diode light sources are unsatisfactory for direct use in flashlights with collimating reflectors due to a narrow viewing angle of the light emitting diode, generally between fifteen (15) degrees and thirty (30) degrees. When the conventional light emitting diode is positioned facing away from the collimating reflector, this narrow viewing angle projects the available light beyond the walls of the collimating reflector. When the conventional light emitting diode is positioned facing toward the collimating reflector, this narrow viewing angle projects the available light to only a portion of the wall of the collimating reflector. The curved collimating reflector wall therefore cannot properly act upon the produced light of conventional light emitting diode light sources to collimated the light beam.

For the above mentioned reasons, substitution of a conventional light emitting diode light source for the conventional incandescent lamp in flashlights, where the flashlight has a curved collimating reflector, will fail because the substitute conventional light emitting diode light source and the existing curved collimating reflector will fail to cooperate to produce an acceptable collimated light beam.

Light emitting diodes are superior to conventional incandescent lamps, (bulbs), because they: 1) require less power, 2) have a longer life, 3) have a greater resistance to both shock and vibration, 4) provide generally higher color temperature and 5) provide higher lumens per watt.

Due to the long life of the light emitting diode light source it is conceivable that a flashlight having a light emitting diode as the light source would never need replacement. Due to the lower power requirement of the light emitting diode light source, batteries of such flashlights would last up to 10 times as long as batteries of conventional flashlights. This combination provides for considerable cost and environmental savings.

A great need exists for collimating reflector type flashlights which have low current draw and long life. Numerous attempts have been made to produce collimating reflector type flashlights which have the desired low current draw and long life. Utilization of the designs of the present invention will fill a long felt need and create a new market niche. The present invention substantially fulfills these needs.

SUMMARY

In view of the foregoing disadvantages inherent in the known types of light production for flashlights having a collimating reflector, your applicant has devised a method of producing light utilizing at least one light emitting diode as the light source. A bulb assembly is provided having a base, a transparent protective cap, a light emitting diode, a central axis and diffusion means. Flashlights applicable to the present invention have a mount for the bulb assembly, a power supply, a first power transfer connector, a second power transfer connector and a switch with the switch having an active position and an inactive position. A collimating reflector will be present during ultimate usage either built into the bulb assembly or, more likely, present on the flashlight. The base will have an exterior, an interior, a first electrical connector, a second electrical connector, an insulator and means to couple the base of the bulb assembly relative to the mount of the flashlight. The first electrical connector is positioned on the exterior of the base and provides for a subsequent connection to the first power transfer connector of the flashlight. The second electrical connector is positioned on the exterior of the base and provides for a subsequent connection to the second power transfer connector of the flashlight. The insulator provides for insulation of the first electrical connector from the second electrical connector to prevent a transfer of power therebetween along the exterior of the base. The transparent protective cap provides for a sealing of at least a portion of the interior of the base. The light emitting diode is positioned within the transparent protective cap. The light emitting diode has a first power coupling, a second power coupling and a light producing surface. The first power coupling receives power transferred from the first electrical connector of the base. The second power coupling transmits power to the second electrical connector of the base. The light producing surface provides for production of light when the switch of the flashlight is in the active position in response to power moving between the first power coupling and the second power coupling. The central axis is aligned through the base and through the transparent protective cap. The diffusion means provides for a dispersion of the light produced by the light emitting diode radially outward from the central axis beyond a dispersion obtainable from a single light producing surface of a single light emitting diode.

My invention resides not in any one of these features per se, but rather in the particular combinations of them herein disclosed and it is distinguished from the prior art in these particular combinations of these structures for the functions specified.

There has thus been outlined, rather broadly, the more important features of the invention in order that the detailed description thereof that follows may be better understood, and in order that the present contribution to the art may be better appreciated. There are, of course, additional features of the invention that will be described hereinafter and which will form the subject matter of the claims appended hereto. Those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

It is therefore a primary object of the present invention to provide for a bulb assembly to produce light for a collimating reflector type flashlight wherein a light emitting diode chip within the bulb assembly produces the light.

Other objects include;
a) to provide for a cluster of light emitting diodes which have approximately the same relative placement within a bulb, and which collectively produce light having similar characteristics to, existing strait filaments of incandescent lamps (bulbs).
b) to provide for an expansion of a projection of the produced light from a light emitting diode for reception by a large surface area of a collimating reflector.
c) to provide for a bulb assembly utilizing a light emitting diode as a light source where the bulb assembly is shaped similarly to existing incandescent bulbs.
d) to provide for a bulb assembly utilizing a light emitting diode as a light source where the bulb assembly has a collimating reflector built into the bulb assembly.
e) to provide for a bulb assembly utilizing a light emitting diode as a light source where the bulb assembly may function with an existing collimating reflector of an existing flashlight.
f) to provide for structures to provide for a diffusion of the light produced by a light emitting diode to broaden the projection thereof to a wide area.
g) diffusion of the light produced to broaden the projection thereof to a wide area.
h) to provide for an extension of a battery power supplies life by utilizing a light emitting diode as the light source for a collimating reflector flashlight compared to the life of the battery power supply when utilizing an incandescent bulb.
i) to provide for an extension of a bulb assemblies life by utilizing a light emitting diode as the light source for a collimating reflector flashlight compared to the life of an incandescent bulb.

These together with other objects of the invention, along with the various features of novelty which characterize the invention, are pointed out with particularity in the claims annexed to and forming a part of this disclosure. For a better understanding of the invention, its operating advantages and the specific objects attained by its uses, reference should be had to the accompanying drawings and descriptive matter in which there is illustrated the preferred embodiments of the invention.

BRIEF DESCRIPTION OF THE DRAWINGS

The invention will be better understood and objects other than those set forth above will become apparent when consideration is given to the following detailed description thereof. Such description makes reference to the annexed drawings wherein;

FIG. 2a is a side elevational view of a light emitting diode strip.

FIG. 2b is a top plan view of the light emitting diode strip shown in FIG. 2a.

FIG. 2c is a perspective view of the light emitting diode strip shown in FIG. 2a and FIG. 2b.

FIG. 3 is an elevational side view of a bulb assembly having the light emitting diode strip shown in FIG. 2a through FIG. 2c incorporated therein.

FIG. 9b is a plan top view of the bulb assembly depicted in FIG. 9a.

FIG. 12a is an elevational side view of a bulb assembly.

FIG. 12b is a plan top view of a segmented reflector as employed within the bulb assembly depicted in FIG. 12a.

FIG. 15 is an exploded perspective view showing the positional orientation of various components relative to a bulb assembly.

FIG. 16 is an exploded perspective view showing the positional orientation of various components relative to a bulb assembly.

DESCRIPTION

Overview

Figure 1:
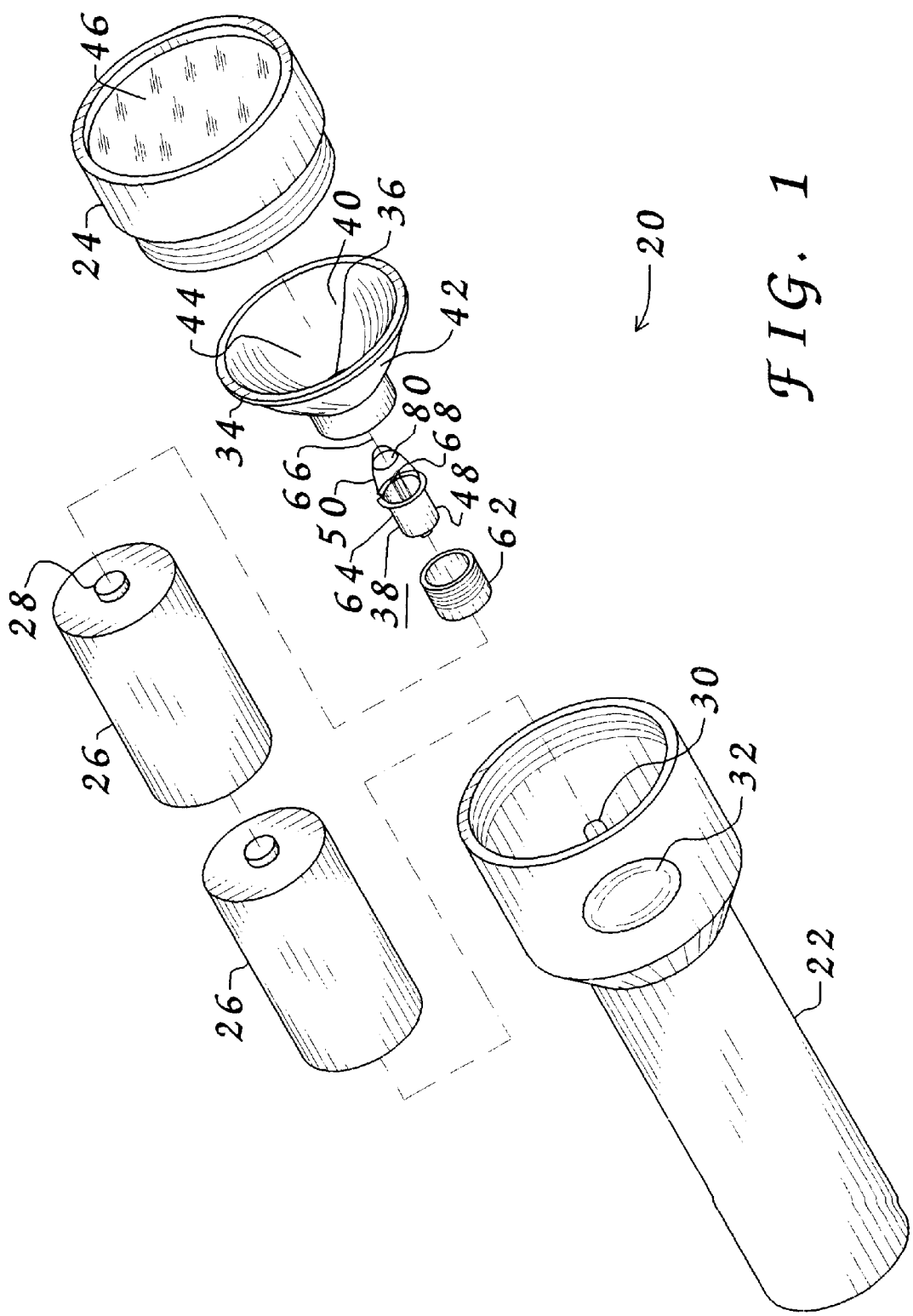
FIG. 1 is an exploded perspective view showing the positional orientation of various components of a flashlight.

Many different bulb assemblies having features of the present invention are possible. The following description describes the preferred embodiment of select features of those bulb assemblies and various combinations thereof. These features may be deployed in various combinations to arrive at various desired working configurations of bulb assemblies.

Reference is hereafter made to the drawings where like reference numerals refer to like parts throughout the various views.

There basically are two (2) general types of configurations which may be employed to practice the present invention. (The term configuration at this point refers to the end product based upon the present invention.) Without regard for the below described type of configuration employed, any of the light emitting diode packages may contain a single light emitting diode chip or may contain multiple light emitting diode chips. Additionally, other modifications, more fully disclosed elsewhere herein, may be made to components of the light emitting diode package, or to components of the flashlight, to provide for more efficient operation thereof.

In a first general type of configuration, a self contained light emitting diode package is provided which may be utilized within flashlights to replace conventional incandescent lamps wherein no other modifications are required to be made to the overall flashlight and wherein no additional collimating reflector assembly is provided within the self contained light emitting diode package. This direct substitution of the conventional bulb with the light emitting diode package provides for utilization of the existing collimating reflector to collimate the produced light into the desired beam of light.

In a second general type of configuration, a self contained light emitting diode package is provided which may be utilized within flashlights, including specially designed flashlights, wherein the self contained light emitting diode package contains a collimating reflector which operates independently to provide for collimation of the produced light into the desired beam of light. This type of self contained light emitting diode package would eliminate utilization, for collimazation of the produced light, of any existing collimating reflector contained within the flashlight.

Collimating Reflector Flashlight

The term collimating reflector, as used herein, refers to that reflector which ultimately brings the produced light, or at least a portion thereof, into alignment in the form of a beam of light for projection by the flashlight. It being understood that certain embodiments of the present invention utilize at least one additional reflector to bring the produced light, or at least a portion thereof, into suitable position for reflection by the collimating reflector of the flashlight into the resultant beam of light. Therefore, when more than one reflector is utilized, the collimating reflector is the reflector which is aligned with, and the final reflector which acts upon the respective light in, the resultant beam of light.

Numerous designs of collimating reflector flashlights exist in the art. Many of these designs may be utilized with the present invention. FIG. 1 depicts one example of such a design wherein a flashlight 20 is shown having a body 22 and a head 24 which are mountable together. Body 22 houses a power supply in the form of batteries 26. Batteries 26 are mounted within body 22 and make contact at a lower extent with an electrical connector as conventionally known in the art, not shown. The outermost battery 26 then has a first power transfer connector 28 positioned thereon. The electrical connector which makes contact with the innermost battery 26 at the base of body 22 then extend upward to a second power transfer connector 30. A switch 32, having an active position, or 'on' setting, and an inactive position, or 'off' setting, provides for user manipulation of a power feed between first power transfer connector 28 and second power transfer connector 30 when other components, more fully disclosed below, provide contact between first power transfer connector 28 and second power transfer connector 30, as conventionally known in the art.

Head 24 accepts positioning therein of a collimating reflector 34. Collimating reflector 34 has a mount 36, (aperture penetrating the lower central location), therein for subsequent installation of a light producing assembly, as exampled in this view by a bulb assembly 38. Collimating reflector 34 has a reflective surface 40 on one side and a conductive surface 42 on the opposing side. Reflective surface 40, which is polished to provide excellent reflective properties, generally defines a reflective cavity 44. Conductive surface 42 is capable of carrying an electrical transfer. A lens cover 46 at the end of head 24 provides for protection of reflective cavity 44 and that portion of bulb assembly 38 positioned therein following assembly of flashlight 20. Lens cover 46 is transparent as conventionally known in the art.

Figure 4A:
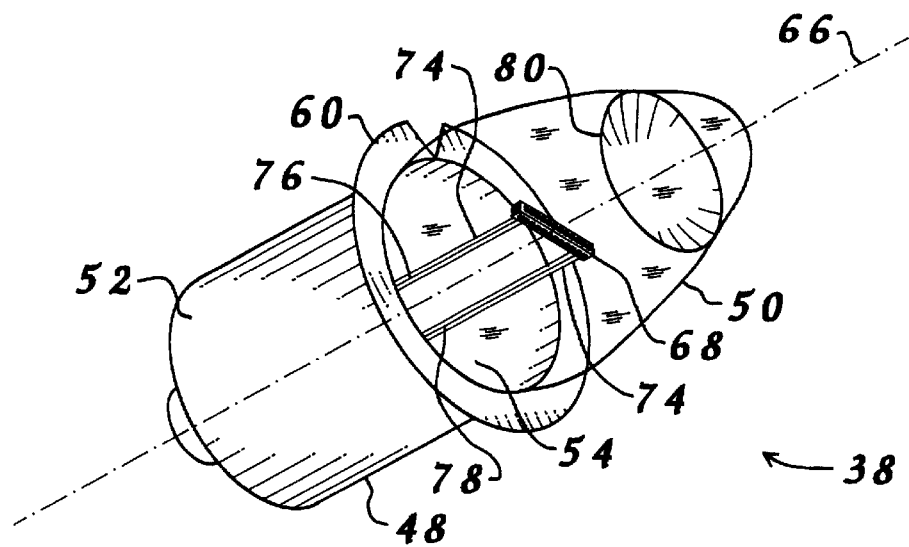
FIG. 4a and FIG. 4b are opposing perspective views of a bulb assembly.
Figure 4B:
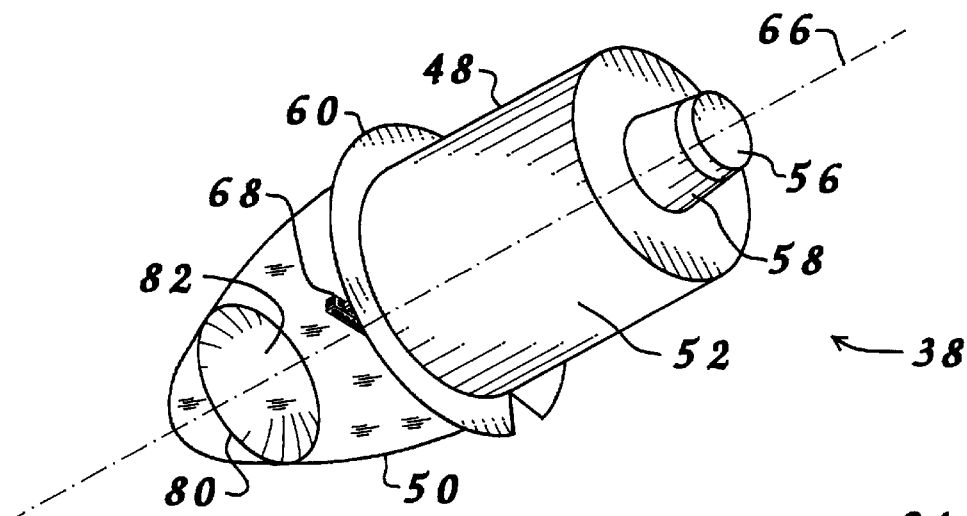

With reference now to FIG. 1, FIG. 3, FIG. 4a and FIG. 4b, bulb assembly 38, being typical of bulb assemblies of the present invention, has a base 48 and a transparent protective cover 50 extending from one end of base 48. Base 48 has an exterior 52 and an interior 54, see FIG. 4a. Preferably, transparent protective cover 50 provides for a sealing of at least a portion of interior 54 of base 48. Certain configurations of bulb assemblies are envisioned which will have the transparent protective cap only covering some of the components attached to the base and not extending downward to actually contact the base. Exterior 52 is capable of carrying an electrical transfer. A first electrical connector 56, see FIG. 4b, is positioned at the end of base 48 and is surrounded, and insulated from, exterior 52 by an insulator 58. First electrical connector 56 is coupled through base 48 to provide power into interior 54 of base 48 for subsequent connection to other components.

Numerous designs are known in the art to provide for coupling means for a mounting of the bulb assembly within the flashlight. A flange 60 extends outward radially from base 48 in close proximity to transparent protective cover 50 and outward beyond the limits of transparent protective cover 50. Flange 60 is capable of carrying an electrical transfer and is an extension of exterior 52. Flange 60 allows bulb assembly 38 to be inserted into mount 36 with flange 60 in contact with collimating reflector 34. This arrangement provides for transparent protective cover 50 to extend through to reflective cavity 44 of collimating reflector 34. A coupling member 62, see FIG. 1, is threaded for attachment to collimating reflector 34 while bulb assembly 38 is positioned within mount 36 to securely hold bulb assembly 38 relative to collimating reflector 34. Therefore, flange 60, in cooperation with exterior 52 of base 48 and conductive surface 42 of collimating reflector 34, forms a second electrical connector 64. Second electrical connector 64 is coupled through base 48 to provide power into interior 54 of base 48 for subsequent connection to other components.

When properly mounted, and when switch 32 is in the active position, first power transfer connector 28 of flashlight 20 may make contact with first electrical connector 56 of bulb assembly 38 to transfer power therebetween. Similarly, second power transfer connector 30 of flashlight 20 may make contact with second electrical connector 64 for conductive communication with exterior 52 of bulb assembly 38 to transfer power therebetween. This arrangement allows power to be active or inactive, depending upon the status of switch 32, to components of bulb assembly 38. As more fully disclosed elsewhere herein, at least one (1) light emitting diode chip will be installed within the area in close proximity to interior 54 of base 48 and the inside of transparent protective cover 50. This light emitting diode chip(s) will receive power from first electrical connector 56 following a subsequent connection and second electrical connector 64 following a subsequent connection.

Bulb Assembly

Light emitting diodes have not been previously utilized in flashlights having collimating reflectors because of their narrow projection angle from the light producing surface thereon. This characteristic of light produced by light emitting diode chips actually benefits implementation of the present invention in that the produced light, while not linear in its projection, is controllable. Due to the narrow projection pattern, it is possible to exert a high level of control over the produced light.

The produced light from the light emitting diode chip(s) must be diffused to a broader angle of projection so as to be able to fully utilize the reflective surface of the collimating reflector. To this end, it is desired to utilize a light emitting diode package which conducts the produced light widely and relatively evenly to the walls of the collimating reflector where the collimating reflector can collimate the light to produce a desired beam of light.

A key aspect of the present invention centers around designs which transform the narrow spectral distribution of the light emitting diode to a broad spectrum illumination source. Certain of the designs provide for the light emitting diode chip(s) to become a three hundred and sixty (360) degree, (radially), illumination source which interacts with the entire reflective surface of the collimating reflector of the flashlight thereby becoming a practical light source.

There are two general methods, which may be used singularly or together, for utilizing light produced by light emitting diode chips for use within a flashlight having a collimating reflector. The first involves a unique placement of a plurality of light emitting diode chips in select orientational patterns. The second involves utilization of various structures to bend the narrow beam of light produced by the light emitting diode chip(s) to a much broader distribution beam of light. The first method may utilize various patterns including linear aligned, radially disposed or semi-spherically disposed. The second method may utilize reflectors, textures on surfaces, lens of an optical type, a molded wave guide angle enhancer type or a fiber optic conduit type. A particularly expedient method involves utilization of both methods wherein a plurality of light emitting diode chips interact with additional diffusion means prior to final collimation by a collimating reflector.

FIG. 1, FIG. 3, FIG. 4a and FIG. 4b depict bulb assembly 38 as having a central axis 66 running therethrough aligned generally through base 48 and transparent protective cover 50. Various designs are possible which provide for non-symmetrical configuration of the bulb assembly. In such an instance, the central axis will be aligned generally with that portion of the base which penetrates the mount of the flashlight.

FIG. 1, FIG. 2a, FIG. 2b, FIG. 2c, FIG. 3, FIG. 4a and FIG. 4b depict a light emitting diode strip 68 having six (6) surface areas 70, (only three clearly shown in FIG. 2c), with each surface area 70 having a plurality of light emitting diodes 72 positioned thereon, (fifty light emitting diodes 72 are thus depicted as being deployed in this example). Light emitting diode strip 68 is depicted in FIG. 1, FIG. 3, FIG. 4a and FIG. 4b positioned within, and being a part of, bulb assembly 38. Light emitting diode strip 68 further has a pair of support posts 74, also see FIG. 2a and FIG. 2c, which provide for placement of light emitting diode strip 68 within bulb assembly 38 and which further provide for power transfer therealong from base 48 of bulb assembly 38. Light emitting diode strip 68 is intended to imitate a conventionally known filament having a linear alignment. Each light emitting diode 72, or bulb assembly 38 generally, may further have additional diffusion feature(s), as elsewhere disclosed herein, incorporated therein to further disperse light produced by light emitting diode strip 68. Such clusters, as exampled by light emitting diode strip 68, may therefore act as an 'area' source of light as used by parabolic, or other type, reflectors which collimate produced light into a collimated beam of light in a flashlight.

Light emitting diode strip 68 is mounted to extend upward from interior 54 of base 48. A first power coupling 76 extends from light emitting diode strip 68 for connection to first electrical connector 56. A second power coupling 78 extends from light emitting diode strip 68 for connection to second electrical connector 64. This arrangement provides for light emitting diode strip 68 to receive power when switch 32 of flashlight 20 is in the active position.

A reflector 80 is positioned within transparent protective cover 50 above light emitting diode strip 68. Reflector 80 has a polished surface 82, see FIG. 3 and FIG. 4b, which reflects light impacting thereon. This diffusion means provides for a dispersion of upwardly projected light produced by light emitting diode strip 68 radially outward from central axis 66 more so than that dispersion available in the absence of the diffusion means.

Figure 5:
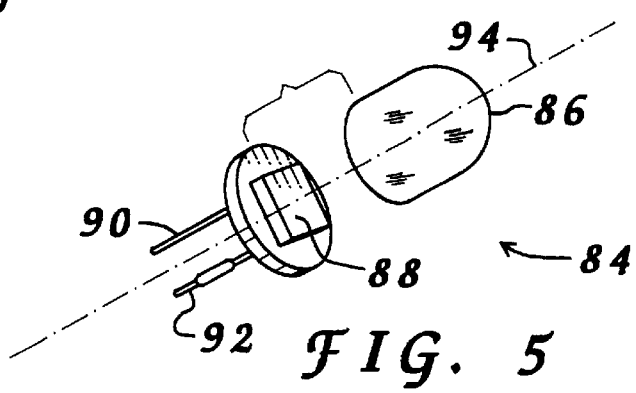
FIG. 5 is a perspective view of a light emitting diode with a protective cover removed therefrom.
Figure 7:
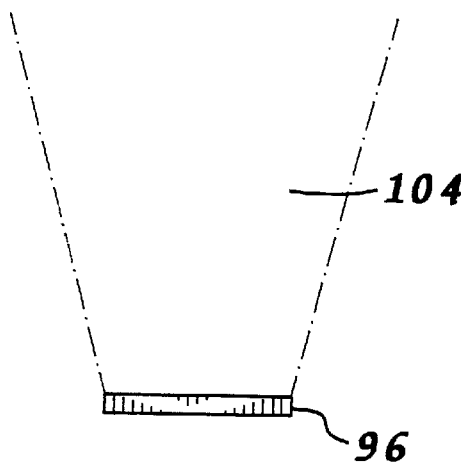
FIG. 7 is an elevational side view of a light emitting diode with a depiction of a projection of produced light.
Figure 8:
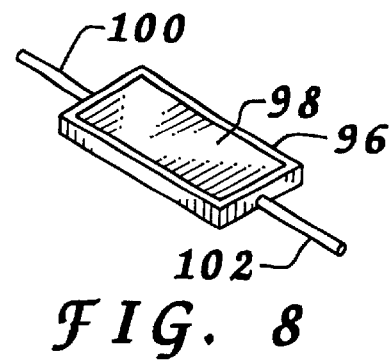
FIG. 8 is a perspective view of a light emitting diode.

Light emitting diodes employed for usage with the present invention may be of many different sizes and shapes. Many conventionally known light emitting diodes may be utilized with the present invention. Any additional components required to enjoy full function of those specific designs, as conventionally known in the art, may be employed as needed. Referring now to FIG. 5, a light emitting diode 84 is depicted having a protective cover 86 which is transparent, shown removably displaced in this view. Light emitting diode 84 has a light producing surface 88 positioned thereon which produces a light when power flows through light emitting diode 84 from a first power coupling 90 to a second power coupling 92. Light producing surface 88 has a central axis 94 extending therethrough. The produced light from light emitting diode 84 has the characteristics associated with conventional light emitting diode light production. In the embodiment depicted, the light extends outward from light producing surface 88, in a slightly expanding pattern, generally aligned with central axis 94. FIG. 8 depicts a light emitting diode 96 having a light producing surface 98 positioned thereon. In this example light producing surface 98 has a rectangular shape. Light producing surface 98 emits light when a power flow moves between a first lead 100 and a second lead 102. FIG. 7 depicts a projection of produced light 104 as may be produced by light emitting diode 96. In this example produced light expands outward at about fifteen (15) degrees.

Figure 6:
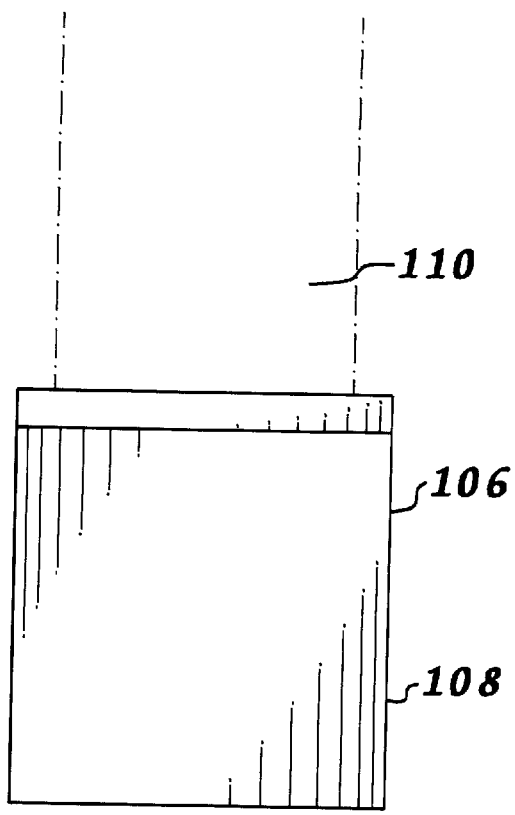
FIG. 6 is a plan view of a representation of a head of a flashlight with a depiction of a desired projection of a beam of light.

FIG. 6 depicts a head 106 of a flashlight 108. Flashlight 108 produces a projection of beam of light 110 wherein such projection extends outward from head 106 with little dispersion.

Bulb Assembly with Collimating Reflector

As generally disclosed elsewhere herein, it is possible, and in certain situations desirable, to have a collimating reflector incorporated into the design of the bulb assembly wherein the bulb assembly may be used to replace an existing incandescent bulb in an existing collimating reflector type flashlight. This provides for the bulb assembly to function without regard for the specific configuration of the existing collimating reflector of the flashlight as the existing collimating reflector is not being utilized to collimate the produced light into the desire beam of light.

Conventionally, bulb assemblies for collimating reflector type flashlights install from behind the collimating reflector and abut the rear of the collimating reflector, or an assembly attached thereto, at a flange and are secured thereto from behind the collimating reflector. This arrangement provides for the light producing portion of the bulb assembly to extend to a forward side of the collimating reflector.

In the case of a bulb assembly having a collimating reflector attached, or attachable, thereto, it is necessary to provide for the light source, and the included collimating reflector, to be installable on the proper, or front, side of the existing collimating reflector while leaving the base, with the power connectors thereon, positioned on the rear side of the existing collimating reflector. This is accomplishable by either providing for installation from the rear of the existing collimating reflector or providing for installation from the front of the existing collimating reflector. When installation is from the front, distinct attachment means must be provided to allow for attachment of the bulb assembly, with the collimating reflector attached thereto, to the existing collimating reflector. When installation is from the rear, distinct attachment means must be provided to allow for attachment of the new collimating reflector relative to the rest of the bulb assembly positioned forward of the existing collimating reflector. Without regard for which method is selected, it is a strong desire that the base of the bulb assembly be positioned behind the existing collimating reflector of the flashlight as conventionally known for utilization of existing power supply structures of the flashlight.

FIG. 15 depicts a bulb assembly 112, having many of the features previously disclosed, and also having a collimating reflector 114 installable thereon. Collimating reflector 114 provides for final collimation of light produced by a light emitting diode 116 of bulb assembly 112 into a desired beam of light. In this example, collimating reflector 114 is threadably attachable relative to the rest of bulb assembly 112. A base 118 is slightly longer than conventional bases on incandescent bulbs to accommodate threads 120 positioned at a forward extend on base 118. Collimating reflector 114 has corresponding threads, not shown, for mating with threads 120. Following insertion of bulb assembly 112 into mount 36 from rearward of the existing collimating reflector 34, collimating reflector 114 is threadably attached to base 118 from forward of the existing collimating reflector 34 to secure bulb assembly 112 thereto. All existing power connection structures normally positioned behind the existing collimating reflector 34 may then be employed as conventionally known including coupling member 62.

FIG. 16 depicts a bulb assembly 122, having many of the features previously disclosed, and also having a collimating reflector 124 installed thereon. Bulb assembly 122 has a flange 126 radially disposed thereon. Collimating reflector 124 extends radially outward from flange 126. Collimating reflector 124 provides for final collimation of light produced by a light emitting diode 128 of bulb assembly 122 into a desired beam of light. In this example, collimating reflector 124 is a permanent attachment relative to the rest of bulb assembly 122. A base 130 is slightly longer than conventional bases on incandescent bulbs to accommodate installation from forward of the existing collimating reflector 34. Threads 132 are positioned on base 130 in close proximity to collimating reflector 124. Following insertion of bulb assembly 122 into mount 36 from forward of the existing collimating reflector 34, a nut 134 is securely threaded relative to threads 132 from rearward of the existing collimating reflector 34 to secure bulb assembly 122 thereto. All existing power connection structures normally positioned behind the existing collimating reflector 34 may then be employed as conventionally known including coupling member 62.

FIG. 15 depicts bulb assembly 112 having a transparent protective cover 136 covering and protecting the light producing structures and extending outward only as required to protect those structures. Collimating reflector 114 remains unprotected by transparent protective cover 136. This arrangement may be utilized with either type of installation.

FIG. 16 depicts bulb assembly 122 having a transparent protective cover 138 extending radially outward to completely cover an interior 140 of collimating reflector 124 which also provides protection for the light producing structures. This arrangement may also be utilized with either type of installation.

Diffusion Means

Any specific diffusion means employed within the present invention is designed to provide for a dispersion of the produced light radially outward from the central axis. This is not intended to imply a spherical dispersion is obtained nor even desired. It is a goal of the present invention to bring as much of the produced light to the collimating reflector at a respective proper impaction angle to provide for collimation of the produced light into the desired beam of light.

1) Reflector

A secondary reflector, (distinct from the collimating reflector), also referred to as a bulb mounted reflector, may be employed to provide for the desired diffusion of the light produced by any deployed light emitting diode chip(s). The secondary reflector may have a panel surface or may have a radially disposed surface. The surface, of either type, may have a smooth continuous surface or may have a segmented, or faceted, surface.

The secondary reflector will utilize optical surface(s) where the light is refracted to a higher angle to achieve the desired diffusion of the produced light. Numerous examples of such diffusion are possible. The following examples indicate the wide possibilities which exist. In one example a chip is integrally molded into a reflector containing various indexes of refraction collimating light to a perfect spot. Another example provides for the light emitting diode(s) to be placed into a reflector incorporating refractive baffles. Still another involves simple optical surfaces incorporating various angles of incidence changing the spectral pattern. Each such example provides for refraction of the produced light to a higher angle which provides for the light emitting diode chip to become a useable lumen source within flashlights having a conventional collimating reflector assembly.

FIG. 1, FIG. 3, FIG. 4a, FIG. 4b and FIG. 15 depict reflector 80 having polished surface 82, see FIG. 3 and FIG. 4b, which is convex shaped. This arrangement provides for dispersion of the produced light from light emitting diode strip 68 outward from central axis 66 in FIG. 1, FIG. 3, FIG. 4a and FIG. 4b and dispersion of produced light from light emitting diode 116 in FIG. 15.

Figure 10:
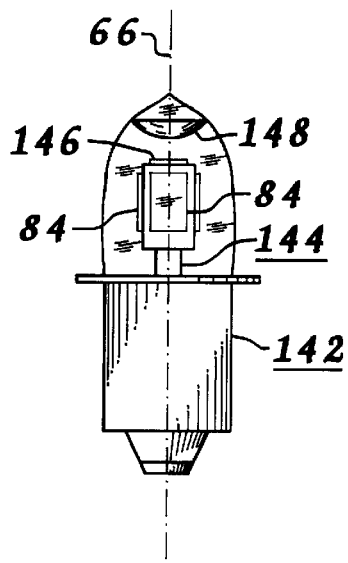
FIG. 10 is an elevational side view of a bulb assembly.

FIG. 10 depicts a bulb assembly 142 having a light production package 144 positioned therein. Light production package 144 has four (4) light emitting diodes 84, (three (3) shown), symmetrically distributed about central axis 66 and one (1) light emitting diode 146 positioned thereabove. Therefore, light production package 144 has five (5) light emitting diodes which distribute light radially outward from central axis 66 and generally aligned along central axis 66. A reflector 148 intercepts that produced light moving along central axis 66 and redirects it back and outward from central axis 66.

Figures 12A, 12B:
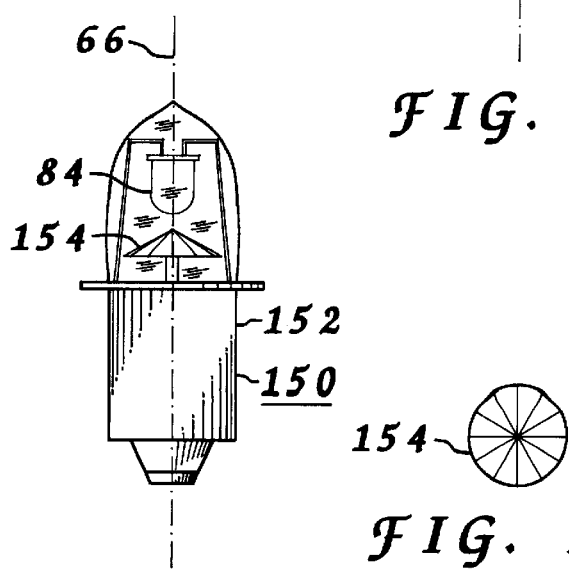

FIG. 12a depicts a bulb assembly 150 having light emitting diode 84 facing back toward a base 152. A segmented reflector 154, also see FIG. 12b, is positioned in the path of light produced by light emitting diode 84 for dispersion thereof away from central axis 66.

FIG. 16 depicts a reflector 156 attached to transparent protective cover 138 for redirection of light produced by bulb assembly 122.

2) Optical Lens

Optical lens, of either molded plastic or ground glass, have an entry optic surface and an exit optic surface. These optic surface(s) are angled to create an angle of incidence which directs and changes the direction of radiated light emitting from the light emitting diode chip following passage therethrough. This provides for the emitted light to leave the optical lens through the exit optic surface at any predetermined angle up to about two hundred and eighty (280) degrees. This provides for the light emitting diode light source to work with flashlight collimating reflectors.

Figure 11:
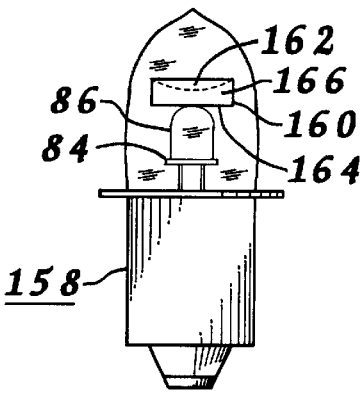
FIG. 11 is an elevational side view of a bulb assembly.

FIG. 11 depicts a bulb assembly 158 having light emitting diode 84 positioned therein. A lens element 160 is depicted attached to protective cover 86 of light emitting diode 84. Lens element 160B has a concave depression 162 positioned distal from light emitting diode 84. Lens element 160 has a receiving side 164 and a dispersing side 166 which is radially disposed. Lens element 160 acts to redirect the light produced by light emitting diode 84.

3) Molded Wave Guide Angle Enhancer Lens

A molded wave guide angle enhancer may be attached to the light emitting diode, or positioned therebefore, to provide for a distribution of the produced light to a broad distribution. This broad distribution provides for precise 'light center length' which matches a collimating reflector's focal point. The molded wave guide angle enhancer may have linear surfaces thereon, may have curved surfaces thereon or may be circular shaped. In any of the designs at least one light emitting diode chip is positioned to project the produced light into the enhancer for distribution therein for eventual discharge over a broad distribution range. The molded wave guide angle enhancer lens may, if desired, be incorporated into the protective container used to protect the light emitting diode, or diodes.

The molded wave guide angle enhancer may have reflectorized wave guides positioned therein to provide for broadening the narrow polar distribution of the light emitting diode device to match a collimating reflector's focal point. Refraction angles are molded into the plastic lens cover where the refraction angles redirect the light to the side walls of the conventional collimating reflector wherein the colli-mating reflector can operate to collimate the light into the desired beam of light.

Such redirection of light may also be performed utilizing fiber optic conduit, of various designs, which may be utilized to distribute the light produced by the light emitting diode to match the collimating reflector's focal point.

Figure 14:
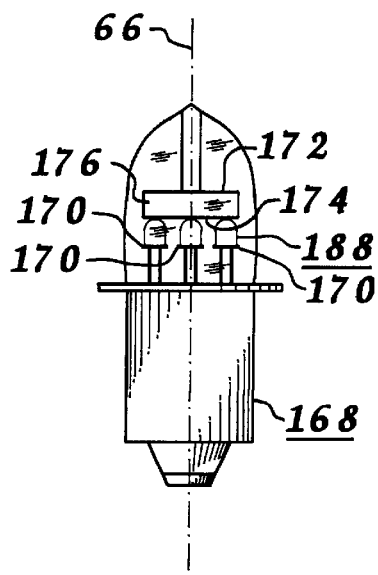
FIG. 14 is an elevational side view of a bulb assembly.

FIG. 14 depicts a bulb assembly 168 having three (3) light emitting diodes 170 positioned therein in a linearly aligned pattern. A molded wave guide angle enhancer 172 has a receiving side 174 and a dispersing side 176. Dispersing side 176 is a radially disposed wall extending three hundred and sixty (360) degrees about central axis 66.

4) Texture of Surface

The produced light of the light emitting diode may be diffused by a textured surface to change the characteristics of the light, and the path thereof, to a greater angle. Following diffusion of the produced light of the light emitting diode, the light emitting diode chip becomes a useable lumen source for applications required in collimating reflector assemblies.

Figure 13:
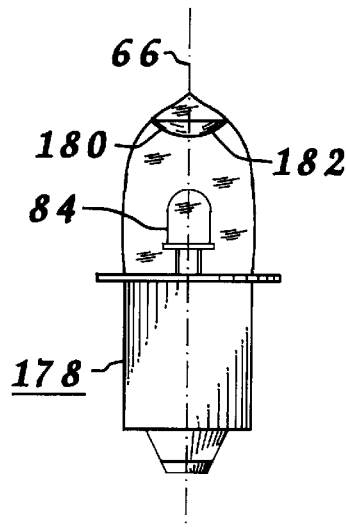
FIG. 13 is an elevational side view of a bulb assembly.

FIG. 13 depicts a bulb assembly 178 having light emitting diode 84 positioned therein. A textured diffuser 180, which is convex shaped, is positioned in the path of light produced by light emitting diode 84. Textured diffuser 180 has a diffusion surface 182 which is rough and reflects light in a random pattern for wide distribution thereof away from central axis 66.

5) Placement of Plurality of Light Emitting Diodes

An array of light emitting diodes may be arranged to provide for the desired diffusion of the produced light to a wider area of the collimating reflector than that possible utilizing a single light emitting diode in the absence of other diffusion means. Various patterns of placement are possible including symmetrical patterns and linear aligned patterns. Each light emitting diode 'chip' of the array may have a distinct protective container protecting the 'chip'. Alternatively, the array of light emitting diode 'chips', or a group thereof, may collectively have a common protective container protecting the array or sub-group. This protective container, whether protecting a single 'chip', a sub-group of 'chips' or the entire array, may be transparent, translucent or diffused plastic or glass. This container may or may not be shaped similarly to a conventional incandescent bulb.

A chip array, preferably in a circular arrangement, in a diffused plastic housing may be utilized to provide for the desired distribution of produced light. In a preferred embodiment, ten (10) chips are distributed every thirty six (36) degrees.

In one embodiment, an array of light emitting diode chips are utilized wherein each chip resides on a unique plane of projection wherein a large surface area of the conventional collimating reflector is utilized for collimation of the produced light into the desired beam of light.

Alternatively, it is possible to utilize a plurality of light emitting diode chips wherein positional placement of the chips in an array provide for the desired broad distribution.

The substrate of the light emitting diode chip is configured to place the light emitting diode chip at right angles to the collimating reflector wall. This results in the substrate of the light emitting diode chip being mounted with an orientation more to parallel with the desired beam of light than with perpendicular to the desired beam of light.

Figure 9A:
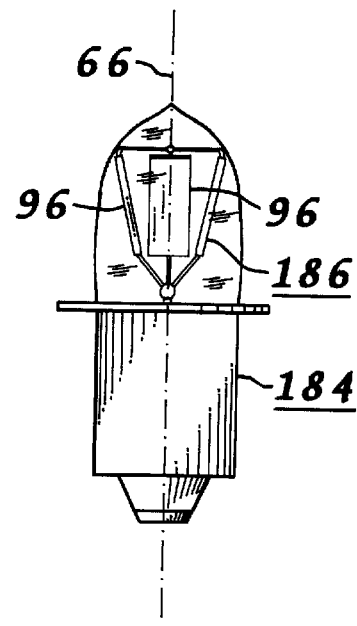
FIG. 9a is an elevational side view of a bulb assembly.
Figure 9B:
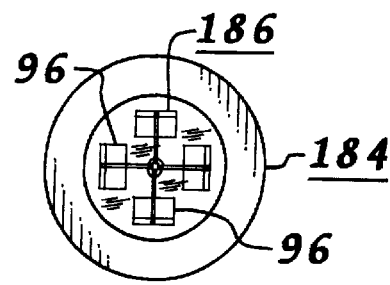

FIG. 9a and FIG. 9b depict a bulb assembly 184 having a symmetrical pattern 186 of four (4) light emitting diodes 96. In this configuration each light emitting diode 96 is angularly offset from central axis 66.

FIG. 10 depicts bulb assembly 142 having light production package 144 having four (4) light emitting diodes 84 radially disposed in a symmetrical pattern about central axis 66 and one (1) light emitting diode 146 positioned thereabove. Bulb assembly 142 therefore depicts the ability to mix various patterns.

FIG. 14 depicts bulb assembly 168 having three (3) light emitting diodes 170 in a linear alignment 188.

Alternatively, it is possible to provide for a cluster of light emitting diodes which have approximately the same relative placement within the bulb, and which collectively produce light having similar characteristics to, existing strait filaments of incandescent lamps (bulbs). Many configurations exist for such clusters including variations in number of light emitting diode mounting surfaces and their respective orientational positioning. It is also possible to provide imitation of filaments which are not linearly aligned including those having an inverted 'V' shape.

As previously disclosed, FIG. 1, FIG. 2a, FIG. 2b, FIG. 2c, FIG. 3, FIG. 4a and FIG. 4b depict light emitting diode strip 68 as having six (6) surface areas 70, with each surface area 70 having a plurality of light emitting diodes 72 positioned thereon. This type of cluster provides for production of light having very similar characteristics as that light produced by conventional linearly aligned filaments of incandescent bulbs. While the characteristics of the produced light generally equal those of conventional incandescent bulbs, such production is vastly superior due to the lower power consumption and the longer life of the components of the bulb assembly.

It is possible, and in certain configurations desirable, to incorporated a multiplexing circuit directly into the bulb assembly or otherwise include such circuit in the flashlight. The multiplexing circuit uses a capacitor to store voltage from a power supply for output as a higher voltage. This is accomplished by having the higher voltage output cycling, (on/off), at an extremely high rate. One example of such a usage involves utilizing a conventional 3 volt power supply, (as exampled by a single 3 volt battery, or two 1.5 volt batteries), and having a light emitting diode which functions at 3.6 volts. The intermittent, or 'electronically chopped', signal of cycles of on/off occur at a high frequency or repetition rate. These cycles occur at a rate with is undetectable by the human eye because it occurs at a response rate higher than the human eye is capable of detecting. This results in the light output from the light emitting diode, even though actually being an intermittent signal, appearing to be visual constantly. This application of multiplexing is unique to light emitting diode flashlights. Battery life is also increased by such usage. The voltage available to the light emitting diode can by varied from about 3.0 volts to about 5.5 volts.

With respect to the above description then, it is to be realized that the optimum dimensional relationships for the parts of the invention, to include variations in size, material, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed is:

1. A bulb assembly for a flashlight, the flashlight having a mount for the bulb assembly, a power supply, a first power transfer connector, a second power transfer connector and a switch, the switch having an active position and an inactive position, the bulb assembly comprising:
    a) a base having:
        1) an exterior;
        2) an interior;
        3) a first electrical connector positioned on the exterior, the first electrical connector to provide for a subsequent connection to the first power transfer connector of the flashlight;
        4) a second electrical connector positioned on the exterior, the second electrical connector to provide for a subsequent connection to the second power transfer connector of the flashlight;
        5) an insulator to provide for insulating the first electrical connector from the second electrical connector;
        6) coupling means to provide for a mounting of the bulb assembly at the base of the bulb assembly to the mount of the flashlight;
    b) a light emitting diode positioned relative to the interior of the base, the light emitting diode having:
        1) a first power coupling to provide for a transfer of power from the first electrical connector of the base;
        2) a second power coupling to provide for a transfer of power to the second electrical connector of the base;
        3) a light producing surface to provide for producing a light when the switch of the flashlight is in the active position in response to power moving between the first power coupling and the second power coupling;
    c) a transparent protective cap to provide for protecting at least a portion of the light emitting diode;
    d) a central axis aligned through the base and through the transparent protective cap;
    e) diffusion means to provide for a dispersion of the light produced by the light emitting diode radially outward from the central axis.

2. The bulb assembly defined in claim 1 wherein the diffusion means further comprises a bulb mounted collimating reflector for transfer of the light produced by the light emitting diode to the collimating reflector of the flashlight.

3. The bulb assembly defined in claim 1 wherein the diffusion means further comprises a lens member having a receiving side and a dispersing side, the receiving side aligned with the light producing surface of the light emitting diode.

4. The bulb assembly defined in claim 1 wherein the light producing surface of the light emitting diode faces away from the base of the bulb assembly.

5. The bulb assembly defined in claim 1 wherein the light producing surface of the light emitting diode faces toward the base of the bulb assembly.

6. The bulb assembly defined in claim 1 further comprising at least one additional light emitting diode and wherein the light emitting diodes are arranged in a symmetrical pattern, the symmetrical pattern radially disposed about the central axis.

7. The bulb assembly defined in claim 1 wherein the flashlight further comprises a collimating reflector disposed about the mount of the flashlight and wherein at least a portion of the light produced by the light emitting diode strikes the collimating reflector of the flashlight.

8. The bulb assembly defined in claim 1 wherein the flashlight further comprises a collimating reflector disposed about the mount of the flashlight and wherein the coupling means of the base further comprises a flange radially disposed about the central axis and wherein the bulb assembly further comprises a collimating reflector radially disposed to extend outward from the flange and wherein the light produced by the light producing surface of the light emitting diode is blocked by the collimating reflector of the bulb assembly from reaching the collimating reflector of the flashlight.

9. A bulb assembly for a flashlight, the flashlight having a mount for the bulb assembly, a power supply, a first power transfer connector, a second power transfer connector and a switch, the switch having an active position and an inactive position, the bulb assembly comprising:
   a) a base having:
      1) an exterior;
      2) an interior;
      3) a first electrical connector positioned on the exterior, the first electrical connector to provide for a subsequent connection to the first power transfer connector of the flashlight;
      4) a second electrical connector positioned on the exterior, the second electrical connector to provide for a subsequent connection to the second power transfer connector of the flashlight;
      5) an insulator to provide for insulating the first electrical connector from the second electrical connector;
      6) coupling means to provide for a mounting of the bulb assembly at the base of the bulb assembly to the mount of the flashlight;
   b) a plurality of light emitting diodes positioned relative to the interior of the base, each of the light emitting diodes having:
      1) a first power coupling to provide for a transfer of power from the first electrical connector of the base;
      2) a second power coupling to provide for a transfer of power to the second electrical connector of the base for transfer of power thereto;
      3) a light producing surface to provide for producing a light when the switch of the flashlight is in the active position in response to power moving between the first power coupling and the second power coupling;
   c) a transparent protective cap to provide for protecting at least a portion of the light emitting diodes;
   d) a central axis aligned through the base and through the transparent protective cap;
   e) diffusion means to provide for a dispersion of the light produced by the plurality of light emitting diodes radially outward from the central axis.

10. The bulb assembly defined in claim 9 wherein the flashlight further comprises a collimating reflector disposed about the mount of the flashlight and wherein at least a portion of the light produced by the plurality of light emitting diodes strikes the collimating reflector of the flashlight.

11. The bulb assembly defined in claim 9 wherein the flashlight further comprises a collimating reflector disposed about the mount of the flashlight and wherein the coupling means of the base further comprises a flange radially disposed about the central axis and wherein the bulb assembly further comprises a collimating reflector radially disposed to extend outward from the flange and wherein the light produced by the light producing surfaces of the plurality of light emitting diodes is blocked by the collimating reflector of the bulb assembly from reaching the collimating reflector of the flashlight.

12. The bulb assembly defined in claim 9 wherein the plurality of light emitting diodes number at least three and wherein the light emitting diodes are arranged in a linear alignment and wherein each of the light emitting diodes has a positional orientation and wherein each of the light emitting diodes have an identical positional orientation in the linear alignment.

13. The bulb assembly defined in claim 9 wherein the diffusion means further comprises an arrangement of the plurality of light emitting diodes and wherein the arrangement further comprises a symmetrical pattern radially disposed about the central axis.

14. The bulb assembly defined in claim 9 wherein the diffusion means further comprises an arrangement of the plurality of light emitting diodes and wherein the arrangement further comprises a symmetrical pattern radially disposed about the central axis and wherein the light producing surfaces are angled relative to the central axis.

15. A bulb assembly for a flashlight, the flashlight having a mount for the bulb assembly, a power supply, a first power transfer connector, a second power transfer connector and a switch, the switch having an active position and an inactive position, the bulb assembly comprising:
   a) a base having:
      1) an exterior;
      2) an interior;
      3) a first electrical connector positioned on the exterior, the first electrical connector to provide for a subsequent connection to the first power transfer connector of the flashlight;
      4) a second electrical connector positioned on the exterior, the second electrical connector to provide for a subsequent connection to the second power transfer connector of the flashlight;
      5) an insulator to provide for insulating the first electrical connector from the second electrical connector;
      6) coupling means to provide for a mounting of the bulb assembly at the base of the bulb assembly to the mount of the flashlight;
   b) a collimating reflector radially disposed to extend outward from the base;
   c) a light emitting diode positioned relative to the interior of the base, the light emitting diode having:
      1) a first power coupling to provide for a transfer of power from the first electrical connector of the base;
      2) a second power coupling to provide for a transfer of power to the second electrical connector of the base;
      3) a light producing surface to provide for producing a light when the switch of the flashlight is in the active position in response to power moving between the first power coupling and the second power coupling;
   d) a transparent protective cap to provide for protecting at least a portion of the light emitting diode;
   e) a central axis aligned through the base and through the transparent protective cap;
   f) diffusion means to provide for a dispersion of the light produced by the light emitting diode radially outward from the central axis;
   wherein at least a portion of the light produced by the light producing surfaces of the light emitting diode strikes the collimating reflector of the bulb assembly.

16. The bulb assembly defined in claim 15 wherein the light producing surface of the light emitting diode faces away from the base of the bulb assembly and wherein the diffusion means further comprises a bulb mounted primary reflector having a light reflective surface and wherein the light reflective surface of the bulb mounted primary reflector faces the light producing surface of the light emitting diode for transfer of at least a portion of the light produced by the light emitting diode to the collimating reflector of the bulb assembly.

17. The bulb assembly defined in claim 15 further comprising at least one additional light emitting diode and wherein the light emitting diodes are arranged in a symmetrical pattern, the symmetrical pattern radially disposed about the central axis and wherein the light producing surfaces of the light emitting diodes face the collimating reflector of the bulb assembly.

18. The bulb assembly defined in claim 15 wherein the diffusion means further comprises a lens member having a receiving side and a dispersing side, the receiving side aligned with the light producing surface of the light emitting diode.

19. The bulb assembly defined in claim 15 wherein collimating reflector further comprises a reflective surface radially disposed about the central axis and wherein the transparent protective cap further seals the reflective surface of the collimating reflector.

20. The bulb assembly defined in claim 15 wherein collimating reflector further comprises a reflective surface radially disposed about the central axis and wherein the reflective surface of the collimating reflector extends beyond the transparent protective cap.

* * * * *